United States Patent
Islam et al.

(10) Patent No.: US 7,307,271 B2
(45) Date of Patent: Dec. 11, 2007

(54) NANOWIRE INTERCONNECTION AND NANO-SCALE DEVICE APPLICATIONS

(75) Inventors: M. Saif Islam, Sacramento, CA (US); Philip J. Kuekes, Menlo Park, CA (US); Shih-Yuan Wang, Palo Alto, CA (US); Duncan R. Stewart, Menlo Park, CA (US); Shashank Sharma, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 253 days.

(21) Appl. No.: 10/982,051

(22) Filed: Nov. 5, 2004

(65) Prior Publication Data
US 2006/0097389 A1 May 11, 2006

(51) Int. Cl.
*H01L 29/06* (2006.01)
*H01L 31/036* (2006.01)

(52) U.S. Cl. ......... 257/14; 257/E29.078; 257/E31.033; 977/763; 977/764; 977/762; 977/938

(58) Field of Classification Search ................... 207/14
See application file for complete search history.

(56) References Cited

U.S. PATENT DOCUMENTS

| | | | |
|---|---|---|---|
| 6,297,063 B1 | 10/2001 | Brown et al. | |
| 6,737,939 B2 | 5/2004 | Hoppe et al. | |
| 6,755,956 B2 | 6/2004 | Lee et al. | |
| 2004/0023253 A1* | 2/2004 | Kunwar et al. | 435/6 |
| 2004/0075464 A1* | 4/2004 | Samuelson et al. | 326/37 |
| 2005/0006673 A1* | 1/2005 | Samuelson et al. | 257/232 |
| 2005/0164432 A1* | 7/2005 | Lieber et al. | 438/149 |

OTHER PUBLICATIONS

Tan, Michael R. T., et al., "Surface Emitting Laser for Multimode Data Link Applications", Hewlett-Packard Journal, Feb. 1995, pp. 67-71.

Ozbay, Ekmel, et al., "Fabrication of High-Speed Resonant Cavity Enhanced Schottky Photodiodes", IEEE Photonics Technology Letters, May 1997, pp. 672-674, vol. 9, No. 5.

Mooradian, Aram, "Pump Up the Power", SPIE'S OE Magazine, Apr. 2002, pp. 30-33.

(Continued)

*Primary Examiner*—Jerome Jackson, Jr.

(57) ABSTRACT

A nano-colonnade structure-and methods of fabrication and interconnection thereof utilize a nanowire column grown nearly vertically from a (111) horizontal surface of a semiconductor layer to another horizontal surface of another layer to connect the layers. The nano-colonnade structure includes a first layer having the (111) horizontal surface; a second layer having the other horizontal surface; an insulator support between the first layer and the second layer that separates the first layer from the second layer. A portion of the second layer overhangs the insulator support, such that the horizontal surface of the overhanging portion is spaced from and faces the (111) horizontal surface of the first layer. The structure further includes a nanowire column extending nearly vertically from the (111) horizontal surface to the facing horizontal surface, such that the nanowire column connects the first layer to the second layer.

20 Claims, 6 Drawing Sheets

OTHER PUBLICATIONS

K. Haraguchi, et al., "Self-organized fabrication of planar GaAs nanowhisker arrays", Appl. Phys. Lett., (Jul. 15, 1996) pp. 386-387, vol. 69.

T. Shimada, et al., "Size, position and direction control on GaAs and InAs nanowhisker growth", Superlattices and Microstructures, (1998) pp. 453-458, vol. 24.

K. Haraguchi, et al., "Growth mechanism of planar-type GaAs nanowhiskers", J. Vac. Sci. Technol. B, (Sep./Oct. 1997) pp. 1685-1687, vol. 15.

A. Tilke, et al., "Coulomb blockade in quasimetallic silicon-on-insulator nanowires", Applied Physics Letters, Dec. 6, 1999, pp. 3704-3706, vol. 75, No. 23.

A. Tilke, et al., "Quantum intererence in a one-dimensional silicon nanowire", Physical Review B, (2003), pp. 075311-1 to 075311-6, vol. 68.

Yi Cui and Charles M. Lieber, "Functional Nanoscale Electronic Devices Assembled Using Silicon Nanowire Building Blocks", Science, Feb. 2, 2001, pp. 851-853, vol. 291.

* cited by examiner

NANOWIRE INTERCONNECTION AND NANO-SCALE DEVICE APPLICATIONS

BACKGROUND

1. Technical Field

The invention relates to nanotechnology. In particular, the invention relates to interconnecting a nanowire between horizontal surfaces of a device or structure.

2. Description of Related Art

A consistent trend in semiconductor technology since its inception is toward smaller and smaller device dimensions and higher and higher device densities. As a result, an area of semiconductor technology that recently has seen explosive growth and generated considerable interest is nanotechnology. Nanotechnology is concerned with the fabrication and application of so-called nano-scale structures, structures having at least one linear dimension between 1 nm and 200 nm. These nano-scale structures are often 50 to 100 times smaller than conventional semiconductor structures.

Nanowires are building blocks of many nano-scale devices, such as nano-scale field effect transistors (FETs), p-n diodes, light emitting diodes (LEDs) and nanowire sensors, to name a few. There are many techniques known in the art for growing or synthesizing nanowires. However, the techniques available for interconnecting the ends of the nanowire to respective surfaces tend to be tedious, expensive and sometimes not reproducible. For example, fabricated nanowires can be aligned or assembled using fluid flow and/or an electric field; and contacted to surfaces with e-beam lithography. As such, these techniques are limited to making contact to usually one nanowire (or one nanowire end) at a time. While these techniques are useful in a research environment and facilitate characterization studies using nanowires, they are not conducive to, and not suitable for, reproducible mass-fabrication of nano-scale devices, such as dense, low-cost device arrays, in a manufacturing environment.

Accordingly, it would be desirable to have a low-cost interconnection technique for nanowires that is conducive to a manufacturing environment. Such a technique would solve a long-standing need in the developing area of a "bottom-up" fabrication approach in nanotechnology.

BRIEF SUMMARY

In some embodiments of the present invention, a method of fabricating a nano-colonnade structure is provided. The method of fabricating comprises providing a wafer having an insulating layer sandwiched between a (111) horizontal surface of a first semiconductor layer and a second layer. The method of fabricating further comprises etching the wafer to expose a portion of the (111) surface and to cantilever a portion of the second layer over the exposed portion. A portion of the insulating layer supports the cantilevered portion. The method further comprises growing a nanowire column from the exposed (111) surface to a facing horizontal surface of the cantilevered portion to bridge the first layer and the second layer.

In other embodiments of the present invention, a nano-colonnade structure is provided. The nano-colonnade structure comprises a first layer of a semiconductor material having a (111) horizontal surface. The structure further comprises a second layer, and an insulator support between the first layer and the second layer that separates the first layer from the second layer. A portion of the second layer overhangs the insulator support, such that a horizontal surface of the overhanging portion is spaced from and faces the (111) horizontal surface of the first layer. The structure further comprises a nanowire column extending nearly vertically from the (111) horizontal surface to the facing horizontal surface of the overhanging portion, such that the nanowire column connects the first layer to the second layer.

In other embodiments of the present invention, a nano-colonnade laser structure is provided. The nano-colonnade laser comprises a first semiconductor layer having a (111) horizontal surface. The first layer comprises a first integrated Bragg reflector. The nano-colonnade laser further comprises a second semiconductor layer and an insulator support. The second layer comprises a second integrated Bragg reflector. The insulator support is between the first layer and the second layer to separate the first layer from the second layer. A portion of the second layer overhangs the insulator support, such that a horizontal surface of the overhanging portion is spaced from and faces the (111) horizontal surface of the first layer. The nano-colonnade laser further comprises a semiconductor nanowire column extending nearly vertically from the (111) horizontal surface to the facing horizontal surface of the overhanging portion, such that the nanowire column connects the first layer to the second layer. The Bragg reflectors and the nanowire column form a laser cavity of a nano-vertical cavity surface emitting laser (nano-VCSEL).

In still other embodiments of the present invention, an interconnected nano-colonnade structure is provided. The interconnected nano-colonnade structure comprises a first nano-colonnade device; a second nano-colonnade device; and a first nanowire column. The nanowire column extends nearly vertically from a (111) horizontal surface of the first device to a horizontal surface of the second device that faces the (111) horizontal surface to connect the first device to the second device.

In still other embodiments of the present invention, a method of interconnecting a nanowire between spaced apart horizontal surfaces is provided. The method of interconnecting comprises growing a nanowire from a (111) horizontal surface of a first semiconductor layer until the nanowire connects to a horizontal surface of a second layer that faces the (111) horizontal surface.

In yet other embodiments of the present invention, a method of interconnecting nano-scale devices with a nanowire is provided. The method of interconnecting devices comprises aligning a first nano-scale device and a second nano-scale device in a stacked relationship, such that a (111) horizontal surface of the first device is spaced apart from and faces a horizontal surface of the second device. The method of interconnecting devices further comprises growing a nanowire from the (111) horizontal surface of the first device until the nanowire connects to the facing horizontal surface of the second device.

Certain embodiments of the present invention have other features in addition to and in lieu of the features described hereinabove. These and other features of some embodiments of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1:
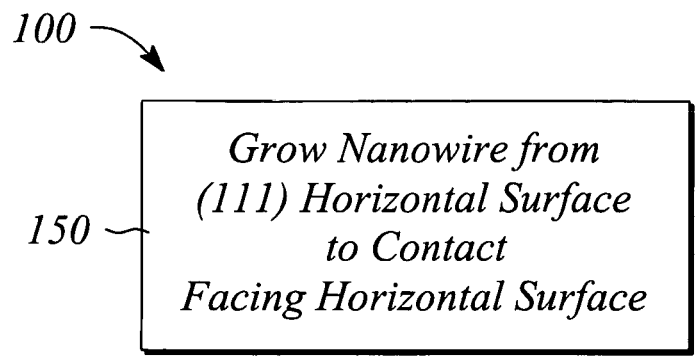
FIG. 1 illustrates a block diagram of a method of interconnecting a nanowire between spaced apart horizontal surfaces according to an embodiment of the present invention.

Embodiments of the present invention are directed growing a nanowire to interconnect vertically spaced apart horizontal surfaces. The horizontal surface from which the nanowire grows is a (111) surface of a [111] oriented semiconductor crystal lattice. A nanowire will grow preferentially nearly normal to the (111) surface. On a horizontally oriented (111) surface, the nanowire will grow substantially vertically from the (111) surface, as a column. The nanowire column growth may be akin to stalagmite growth in geology, for example and not by way of limitation. The nanowire column will grow at least until it contacts a facing horizontal surface. Once contacted, the nanowire column will attach or connect to the facing horizontal surface. The contacted nanowire may form a secondary nanowire on the facing horizontal surface that grows from the facing surface in a direction that depends on the crystal lattice orientation of the facing surface. The crystal orientation of the facing horizontal surface can be any orientation including, but not limited to, one of a [110], [111] and [100] crystal lattice orientation for nanowire attachment. If formed, the secondary nanowire will grow nearly normal to the facing horizontal surface if also a (111) surface, which is essentially back toward the original (111) horizontal surface. Among other things, various embodiments of the present invention may provide a massively parallel, self-assembly technique for interconnecting nanowire columns between spaced apart horizontal surfaces. When the horizontal surfaces are surfaces of doped semiconductor layers, such as highly doped semiconductor layers, the grown semiconductor nanowire column forms a circuit connection between electrodes.

The use of brackets '[]' herein in conjunction with such numbers as '111', '110' and '100' pertains to a direction or orientation of a crystal lattice. The use of parenthesis '( )' herein with respect to such numbers '111', '110' and '100' pertains to a plane or a planar surface of a crystal lattice. Such use is intended to follow standard crystallographic nomenclature known in the art.

The semiconductor materials useful for the various embodiments-of the present invention include, but are not limited to, group IV, group III-V and group II-VI semiconductor materials, including compound semiconductor materials, from the Periodic Table of the Elements. A first or growth-originating layer or substrate, from which a nanowire is grown, is a semiconductor material from the groups listed above, or another semiconductor material, that forms a [111] crystal lattice, and therefore has a (111) horizontal surface. A second layer, to which the nanowire is grown to connect, may be a metal material, a semiconductor material either from any of the groups listed above or another semiconductor material that has any crystal orientation, or a metal-semiconductor alloy, for example, depending on the application. Metal materials useful as the second layer include, but are not limited to, aluminum (Al), palladium (Pd), platinum (Pt), and copper (Cu), or the metals listed below by way of example for the nanowire, for example. An example of a metal-semiconductor alloy includes, but is not limited to, titanium-silicide ($TiSi_2$), for example. An insulator layer, which separates the first layer from the second layer, is any material that is capable of being made insulating including, but not limited to, a semiconductor material from the groups listed above, or another semiconductor material. Moreover, the insulating material may be an oxide or a nitride of any of those semiconductor materials, such that insulating properties of the material are facilitated. The first layer and the second layer may be doped semiconductors to impart a target amount of electrical conductivity or other characteristic for an intended purpose, such as being highly doped for electrode applications, for example. The insulator layer is typically undoped to ensure the insulating properties.

The nanowire may be a metal material, or may be a semiconductor material either from any of the groups listed above, or another semiconductor material. For example and not by way of limitation, the nanowire may be made from metal including, but not limited to, one or more of titanium (Ti), bismuth (Bi), tellurium (Te) and lead (Pb), or the metals listed above for the second layer. In other examples, the nanowire may be a semiconductor including, but not limited to, any of silicon (Si), germanium (Ge), silicon carbide (SiC), gallium arsenide (GaAs), gallium nitride (GaN), gallium phosphide (GaP), indium phosphide (InP), indium arsenide (InAs), aluminum nitride (AlN), zinc oxide (ZnO), indium oxide (InO), indium tin oxide (ITO) and cadmium sulfide (CdS), for example, or a metal-semiconductor alloy, such as those described above by way of example for the second layer. Numerous nanowire materials are known in the art. The scope of the various embodiments of the present invention is intended to include all such materials. In some embodiments, the nanowire is a single crystal structure, while in other embodiments, the nanowire may be an amorphorous or multi-crystalline structure. The nanowire material is compatible with the materials of the first or growth-originating layer and the second layer for a respective intended application. In some embodiments, a semiconductor nanowire may be doped to impart a target amount of electrically conductivity or other property, depending on the application.

The semiconductor and other materials have characteristic properties that impart different electrical, quantum, chemical and/or physical results. A nanowire can be grown such that one or more of length, diameter, shape, direction of growth, and position of the nanowire are controlled in accordance with some embodiments of the present invention. The semiconductor materials used in the first layer and the second layer may include, but are not limited to, the list of nanowire materials from above, for example.

In some embodiments of the present invention, a method 100 of interconnecting a nanowire between spaced apart horizontal surfaces is provided. FIG. 1 illustrates a block diagram of the method 100 of interconnecting a nanowire between spaced apart horizontal surfaces according to an embodiment of the present invention. The method 100 comprises growing 150 a nanowire from a (111) horizontal surface of a first layer of a semiconductor material until the nanowire connects to a horizontal surface of a second layer that faces the (111) surface in a vertically spaced apart relationship.

For example, a silicon nanowire is a semiconductor nanowire comprising Si. The semiconductor nanowire may be a single crystal of Si, or may comprise a controlled boundary at a given position along the nanowire during growth 150, such as a heterojunction, for example, to control electronic properties of the nanowire. Silicon nanowires grow in a direction that is nearly normal to a (111) plane of a crystal lattice. For example, a silicon nanowire can grow substantially perpendicular from a (111) surface of a first semiconductor layer, substrate or wafer made of Si or GaAs. Similarly, a GaAs nanowire will grow nearly normal to a (111) plane of a crystal lattice, such as a first semiconductor layer, substrate or wafer made of GaAs or Si.

In some embodiments, the first layer and the second layer are spaced apart by an insulator layer support. In some embodiments, the first layer and the nanowire are doped to impart target amounts of electrically conductivity thereto. In some of these embodiments, the second layer is a semiconductor material that is also doped for electrically conductivity purposes. In some embodiments, the layers and the nanowire are lattice matched. As such, the method 100 of interconnecting may be used to electrically connect together electrodes of a nano-scale electronic circuit or to electrically connect electrodes of different nano-scale devices in the manufacture of electronic, optoelectronic, and sensor nano-scale devices or systems, for example.

Methods of growing nanowires and the mechanisms of growth are known. All of such methods of growth are within the scope of the embodiments described herein. See for example, co-pending application Ser. No. 10/738,176, filed Dec. 17, 2003, which is incorporated by reference in its entirety herein. As described in the co-pending application, metal-catalyzed growth employs a metal nanoparticle catalyst that can produce highly oriented, metal-catalyzed nanowires using chemical vapor deposition (CVD). Typical metal nucleating catalyst materials include, but are not limited to titanium (Ti), gold (Au), iron (Fe), cobalt (Co), gallium (Ga), and alloys thereof. Nonmetal catalyzed growth is also known. A typical nonmetal catalyst material is $SiO_x$, where x ranges from about 1 to less than 2, for example. Typical nanoparticle catalysts corresponding to Ti and Au catalyst materials, for example, are respectively $TiSi_2$ and Au—Si alloy.

The nucleating catalyst material is deposited on a surface in a very thin layer and annealed in a controlled environment (i.e., chamber) to form isolated nanoparticles of the catalyst material. Alternatively, when the nanoparticle catalyst is directly deposited, annealing may be optional. Then, a nanowire material-containing gas is introduced into the controlled environment. The nanoparticle catalyst accelerates decomposition of the gas, such that atoms of the nanowire material precipitate between the nanoparticle catalyst and the (111) horizontal surface to initiate nanowire growth.

The nanowire will grow 150 from under the nanoparticle on the (111) horizontal surface in columnar form, taking the nanoparticle with it at its tip, to bridge across a space between the (111) surface and a facing horizontal surface. The nanowire with the nanoparticle tip will contact and further attach or weld to the facing horizontal surface with continued catalyzed decomposition of the gas. The attachment is epitaxial in nature, is mechanically strong and robust and has a low electrical resistance, which may be due to the epitaxial attachment. The attachment mechanism is dependent on the nanoparticle type. For example, Ti-containing nanoparticle remains a solid at the tip of the growing nanowire, while Au-containing alloy nanoparticle remains molten at the nanowire tip. Their mechanisms for attachment to the facing surface have different characteristics. Co-pending application Ser. No. 10/738,176, incorporated by reference and cited supra, describes mechanisms of attachment to the facing surface for solid and liquid phase nanoparticle types.

For example, when a Au-nucleated Si nanowire impinges on the facing horizontal surface, the axial growth stops, and the molten Au—Si alloy spreads radially, contributing to catalytic decomposition of the nanowire material-containing gas (e.g., $SiH_4$ gas) and further accelerated deposition. The continued accelerated deposition forms a disc of material extending radially outward from the contact point along the facing horizontal surface, due at least in part to the liquid phase of the Au—Si alloy. However, when a Ti-nucleated Si nanowire impinges on the facing horizontal surface, a radially disc deposit is not observed, yet the attachment is still mechanically robust, due at least in part to $TiSi_2$ being in solid phase during nanowire growth.

Figure 2:
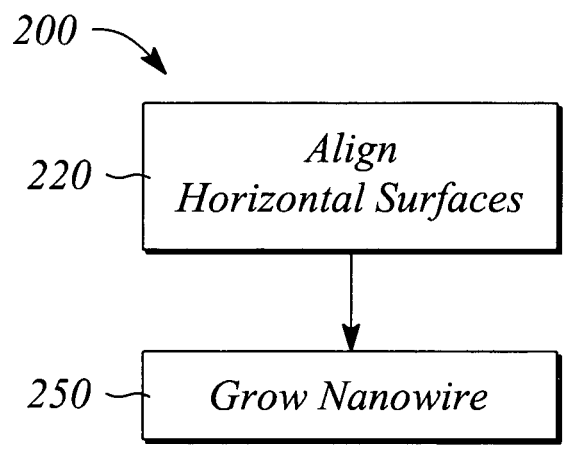
FIG. 2 illustrates a block diagram of a method of interconnecting nano-scale devices with a nanowire according to an embodiment of the present invention.

In other embodiments of the present invention, a method 200 of interconnecting nano-scale devices with a nanowire is provided. FIG. 2 illustrates a block diagram of the method 200 of interconnecting nano-scale devices with a nanowire according to an embodiment of the present invention. The method 200 comprises aligning 220 a first nano-scale device and a second nano-scale device in a vertically stacked relationship. The first device has a (111) horizontal surface of a semiconductor layer (i.e., the first or growth-originating layer). When aligned 220, the (111) horizontal surface of the first device is spaced apart from and faces a horizontal surface of a layer of the second device (e.g., the second layer). The method 200 of interconnecting further comprises growing 250 a nanowire vertically from the (111) horizontal surface until the nanowire contacts the horizontal surface of the second device layer. The contact between the nanowire and the second device surface is a physical attachment to the surface, and may include an electrical connection thereto, depending on the embodiment. Nanowire growth 250 according to the method 200 may be essentially the same as that described above for nanowire growth 150 of the method 100 of interconnecting a nanowire.

In other embodiments of the present invention, a method 300 of fabricating a nano-colonnade structure is provided.

Figure 3:
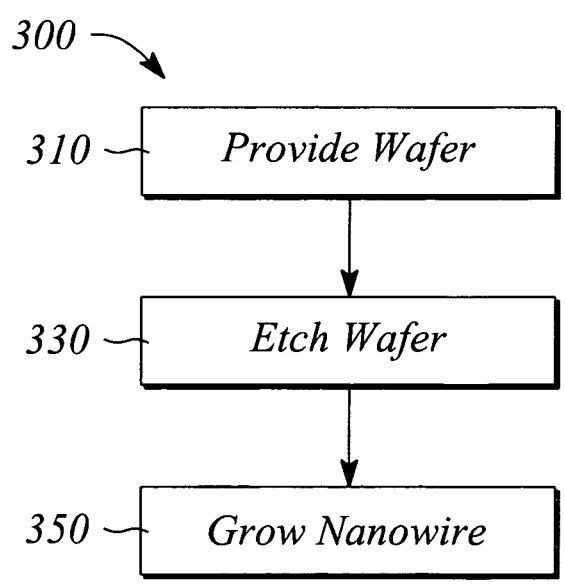
FIG. 3 illustrates a block diagram of a method of fabricating a nano-colonnade structure according to an embodiment of the present invention.

FIG. 3 illustrates a block diagram of the method 300 of fabricating a nano-colonnade structure according to an embodiment of the present invention. The method 300 of fabricating comprises providing 310 a wafer or substrate that has an insulator layer, or a layer of a material that is capable of being made insulating, sandwiched between a first semiconductor layer and a second layer. The first semiconductor layer has a [111] semiconductor crystal orientation and as such, has a planar (111) horizontal surface. The insulator layer is adjacent to the (111) horizontal surface. The second layer is adjacent to the insulator layer and has planar, horizontal surface. The second layer may be a semiconductor material that has any semiconductor crystal orientation, such as a [111], [110] or [100] orientation, for example, such that the horizontal surface of the second semiconductor layer has a corresponding orientation.

In some embodiments, the wafer or substrate is provided 310 comprising using a silicon-on-insulator (SOI) wafer polished in a [111] direction. The (111) silicon is the first semiconductor layer. The insulator is a handle or support for the (111) silicon. Providing 310 the wafer further comprises growing a material that can act as an insulator layer on the (111) silicon layer. For example, a silicon dioxide ($SiO_2$) layer can be grown using known techniques on the (111) silicon layer. The grown insulator layer is considered partly sacrificial for reasons described below. Providing 310 the wafer further comprises growing an epitaxial layer of silicon on the $SiO_2$ insulator layer. The epitaxially grown silicon layer is the second semiconductor layer. Herein, 'growing' with respect to the wafer layers is intended to be used interchangeably with 'depositing' and is not intended to be limited to any particular technique for forming the respective layer, unless otherwise indicated. For example, epitaxy growth is considered a deposition technique. Hereinafter, 'growing' and/or 'depositing' may be referred to more generally as 'forming' for simplicity purposes and without limitation.

In other embodiments, the wafer or substrate is provided 310 comprising using a GaAs-on-insulator wafer polished in the [111] direction. The GaAs layer is the first semiconductor layer with the (111) horizontal surface. The insulator is a handle or support for the GaAs layer. Providing 310 further comprises growing a material that will act as an insulating layer, such as AlAs or InAs, for example. Similar to that described above for the SOI wafer, providing 310 further comprises epitaxially growing a GaAs layer on the AlAs or InAs layer. The epitaxially grown GaAs layer is the second semiconductor layer having any crystal orientation. As long as the AlAs or InAs layer is undoped, it will provide sufficient insulating properties to isolate the GaAs layers. Optionally, the AlAs or InAs layer may be selectively oxidized after the second GaAs semiconductor layer is patterned, as described below, to enhance the isolation between the GaAs layers.

Moreover, in some embodiments, similar lattice matched semiconductor materials can be grown on InP to implement an optoelectronic device. For example, a semi-insulating $In_{(0.52)}Al_{(0.48)}As$ layer may be grown on a doped InP wafer, followed by growing another doped InP layer on the semi-insulating layer. All of such layers are lattice matched.

In some embodiments, the first semiconductor layer and the second semiconductor layer of the provided 310 wafer or substrate are both epitaxially grown using techniques including, but not limited to, molecular beam epitaxy (MBE), molecular beam chemical vapor deposition (MOCVD) and CVD, for example. The first semiconductor layer is grown on an insulating substrate or support and has a (111) horizontal surface. A material that will act as an insulator is grown, deposited or formed on the grown first semiconductor layer. Then, the second semiconductor layer is grown on the insulator material layer and has any crystal orientation.

In some embodiments, providing 310 the wafer or substrate further comprises doping one or both of the first and second semiconductor layers with a p-type and/or an n-type dopant, according to known techniques for doping, to achieve a target electrical conductivity (e.g., highly doped for electrodes) or a depletion region, for example, for a particular application of a nano-scale device, such as a nano-laser or a nano-pn diode, for example. The semiconductor layers may be doped to achieve any particular dopant level, dopant gradients or depletion region. Moreover, in some embodiments, providing 310 further comprises integrating different material layers into one or both of the first and second semiconductor layers, depending on the application of the nano-colonnade structure.

In an optoelectronic application, a Bragg reflector or mirror may be integrated into one or both of the first semiconductor layer and the second semiconductor layer, for example. One or more materials with indices of refraction that differ may be grown in alternating layers on the respective semiconductor layer to make the integrated Bragg reflector. The Bragg reflector layers are grown also by techniques including, but not limited to, molecular beam epitaxy (MBE), molecular beam chemical vapor deposition (MOCVD) and CVD, for example, with target thicknesses. At least one of the materials has an index of refraction that is different from the index of refraction of the semiconductor layer material in which it is integrated. In some embodiments, the Bragg reflector materials are lattice matched to the semiconductor layer material. For example, GaAs and AlAs have indices of refraction that differ by about 0.5. On a GaAs semiconductor layer (e.g., the first semiconductor layer), a few alternating layers of AlAs and GaAs are grown to target thicknesses, which depend on a wavelength of light to be reflected, to make a Bragg reflector. See for example, Ekmel Özbay et al., M. Saiful Islam, et al., "Fabrication of High-Speed Resonant Cavity Enhanced Schottky Photodiodes", *IEEE Photonics Technology Letters*, Vol. 9, No. 5, May 1997, pp. 672-674, incorporated herein by reference.

The method 300 of fabricating a nano-colonnade structure further comprises etching 330 the wafer to expose a portion of the (111) horizontal surface of the first semiconductor layer. Etching 330 comprises etching the second semiconductor layer, and further etching the insulator layer between the semiconductor layers. The insulator layer is etched 330 partly sacrificially, such that a portion of the second semiconductor layer is cantilevered by the etched insulator layer over the exposed portion of the first semiconductor layer. The insulator layer remaining after etching essentially supports the cantilevered portion of the second semiconductor layer. The cantilevered portion of the second semiconductor layer has an exposed horizontal surface that faces the exposed (111) horizontal surface of the first semiconductor layer in a spaced apart, vertically stacked relationship.

The method 300 of fabricating a nano-colonnade structure further comprises growing 350 a nanowire column from the exposed (111) horizontal surface of the first semiconductor layer to the facing horizontal surface of the cantilevered portion of the second semiconductor layer. The nanowire column grows 350 to contact and attach to the facing horizontal surface to bridge or connect the first semiconductor layer and the second semiconductor layer. The nanowire column growth 350 may be essentially similar to the nanowire growth 150 described above for the method 100.

In some embodiments, growing 350 the nanowire column comprises doping the nanowire column to impart or enhance a target characteristic or property, such as electrical conductivity, depletion, and sensitivity. A variety of factors may affect depletion characteristics that include, but are not limited to, depletion region thickness, nanowire diameter, dopant used, dopant concentration, solid solubility of the dopant in the semiconductor material of the nanowire, and quantum effects. For example, a silicon nanowire column may be grown 350 using an $H_2/SiH_4/HCl$ gas in a CVD deposition chamber. During the introduction of the $H_2/SiH_4/HCl$ gas, a p-type dopant, such as a diborane $B_2H_6$ gas, can be added to the $H_2/SiH_4/HCl$ gas ambient. As such, nanowire columns having a diameter of about 100 nm may incorporate the p-type boron dopant into the nanowire columns during growth 350 at concentrations from about low-$10^{17}/cm^3$ to about mid-$10^{18}/cm^3$, for example and not by way of limitation herein.

In some embodiments, growing 350 the nanowire column comprises introducing a quantum dot (QD) into the growing nanowire column. Introducing a QD during nanowire growth 350 comprises introducing a small quantity of a material having a different band gap than the growing nanowire, for example. The QD is like a quantum well where different energy levels are achieved. Since a QD is a cluster of atoms that forms a super atom, the small quantity can have an energy level like a single atom. For example, a nanowire of InP (having a high band gap) may be grown 350 for a period of time. A small segment of InGaAs (having a low band gap) may be introduced (i.e., grown) near a mid-point of the growing 350 InP nanowire, for example. Then, the growth 350 of the InP nanowire is resumed.

In some of these embodiments, growing 350 the nanowire column with an introduced QD further comprises introducing a Bragg reflector into the growing nanowire column. For example, Bragg reflectors may be introduced near opposite ends of the growing 350 nanowire when the QD is introduced near the mid-point of the growing nanowire to be spaced from and between the Bragg reflectors. As discussed above for Bragg reflectors introduced into one or both of the first semiconductor layer and the second semiconductor layer, materials having different indices of refraction may be introduced into the nanowire during growth 350 in alternating layers to make a Bragg reflector in the nanowire. At least one of the materials has an index of refraction that is different from the index of refraction of the nanowire material.

Etching 330 the wafer comprises patterning the second semiconductor layer such that some of the second layer is removed. For example, a masking material may be applied to the surface and patterned, such that the patterned mask covers those areas of the surface which are not to be removed and does not cover those areas which are to be removed. Then an etchant is used to remove the areas of the second layer that are unprotected by the mask. The materials and methods of masking and removing (i.e., 'patterning') are dependent on the semiconductor material used for the second semiconductor layer and are known in the art and not considered a limitation herein. All of such materials and methods are within the scope of the method 300 embodiments herein.

For example, one or more techniques including, but not limited to, e-beam lithography, photolithography, ion milling, reactive ion etching (RIE), and wet chemical etching may be used, depending on the embodiment. For example, potassium hydroxide (KOH) is a wet chemical etchant useful for etching silicon, and hydrofluoric acid (HF) is a wet chemical etchant useful for etching $SiO_2$. GaAs may be wet chemically etched with $H_2SO_4$. Moreover, it is within the scope of the various embodiments described herein to use a combination of dry and wet etching processes for some semiconductors wafers, such as for a Group III-V compound semiconductor. For example, dry etching (e.g., RIE) followed by wet etching to smooth the dry-etched surfaces may be used.

References that provide materials and processes useful for processing semiconductor materials in more detail include, but are not limited to, *Modern GaAs Processing Methods* by Ralph E. Williams, Artech House; (July 1990); *InP-Based Materials and Devices: Physics and Technology* by Osamu Wada (Editor), Hideki Hasegawa (Editor), Wiley-Interscience; (April 1999), pp. 295-309; and *InP and Related Compounds: Materials, Applications and Devices* (Optoelectronic Properties of Semiconductors and Superlattices), M. O. Manasreh (Editor); Taylor & Francis; (Aug. 1, 2000). These and other references, such as *High-Speed Semiconductor Devices*, Edited by S. M. Sze, A Wiley-Interscience Publication, John Wiley & Sons, Inc., 1990 and S. Hirose et al, *Appl. Phys. Letts.* 74 (1999) 964-966 are readily available to those skilled in the art, and are incorporated herein by reference.

In some embodiments, the second semiconductor layer is patterned to open a trench or gap in the second semiconductor layer, thereby leaving separated sections of the second semiconductor layer on either side of the gap. In other embodiments, the second semiconductor layer is patterned to leave a second layer section on a side of the wafer, while removing the rest of the second semiconductor layer. In still other embodiments, the second semiconductor layer is patterned to leave a section of the second layer in an approximate middle of the wafer, while removing the second semiconductor layer from opposite sides of the middle section. Numerous other patterns of the etched 330 second semiconductor layer may be produced by etching 330, all of which are within the scope of the method 300.

Etching 330 the wafer further comprises etching the insulator layer exposed by patterning the second semiconductor layer. Etching the insulator layer comprises removing the insulator layer through an opening in the second semiconductor layer to expose the (111) horizontal surface of the first semiconductor layer. Depending on the pattern of the removed second semiconductor layer, a sacrificial amount of the insulator layer is removed to cantilever a portion of the remaining second semiconductor layer over the exposed (111) surface while an unsacrificial amount of the insulator layer remains to support the cantilevered portion of the second semiconductor layer. As a result, the cantilevered portion of the second semiconductor layer, supported by the remaining insulator layer, hangs over the first semiconductor layer with a horizontal surface of the cantilevered portion facing the exposed (111) surface of the first semiconductor layer. As mentioned above for the second semiconductor material, the materials and methods of removing the insulator layer are dependent on the material used for the insulator layer and are known in the art. All of such materials and methods are within the scope of the method 300 embodiments herein. For example, one or more of a lithographic technique, a dry etching technique (e.g., RIE) or a wet chemical etching technique may be used, that is capable of removing the insulator layer anisotropically, including partly removing the insulator layer from under the second semiconductor layer. As such, the technique used will undercut the insulator layer through the opening in the patterned second semiconductor layer to form the cantilevered portion of the second layer.

Referring back to the GaAs wafer example where an AlAs or InAs material is used as the insulator layer, optionally the AlAs or InAs layer may be selectively oxidized to enhance the isolation of the GaAs semiconductor layers from each other. In some embodiments, after etching of the second GaAs semiconductor layer, but before etching of the AlAs or InAs insulator layer, the AlAs or InAs layer is oxidized, such that increased isolation between the second GaAs layer and the first GaAs layer is achieved.

Growing 350 comprises depositing a nanoparticle on the (111) horizontal surface of the first semiconductor layer through the opening created in the etched 330 wafer, such that the nanoparticle is at least deposited on areas of the (111) surface that underlie the cantilevered portion of the second semiconductor layer. Herein, the term 'nanoparticle' is used interchangeably to describe a catalyst material deposited and annealed into a nanoparticle catalyst and a nanoparticle catalyst directly deposited with optional annealing, unless a distinction is warranted. A number of catalyst materials and nanoparticle catalysts have been described above and with reference to co-pending application Ser. No. 10/738,176, incorporated by reference and cited supra, that may be used in the various embodiments of the present invention.

In some embodiments, the nanoparticle is deposited at an angle to a plane or planes defining the opening in the patterned second semiconductor layer. Angle deposition facilitates depositing the nanoparticle on the areas of the (111) surface that underlie the cantilevered portion of the second semiconductor layer. Growing 350 further comprises growing the nanowire column from a location of the nanoparticle on the (111) horizontal surface in a direction approximately vertical to the (111) surface to contact and connect or attach to the facing horizontal surface of the cantilevered portion of the second semiconductor layer, as described above.

In some embodiments, growing 350 further comprises removing extraneous nanowire columns, which are nanowire columns that grow but do not bridge the first semiconductor layer to the second semiconductor layer. The extraneous nanowire columns may be removed with RIE, for example, or using another technique, that will selectively remove the extraneous nanowire columns. The remaining structure is a nano-colonnade structure that comprises nanowire columns bridging between a cantilevered semiconductor layer and a [111] oriented semiconductor layer, wherein the layers are otherwise isolated by an insulator support therebetween.

In some embodiments, the method 300 of fabricating a nano-colonnade structure further comprises partitioning the patterned second semiconductor layer into physically separated sections to form an array of nano-colonnade devices with a common first semiconductor layer (e.g., electrode) and separate second semiconductor layer segments (i.e., partitioned electrodes). Partitioning comprises masking the patterned second semiconductor layer such that individual masks are aligned approximately perpendicular to a main direction of the opening formed in the patterned second layer and approximately parallel to a direction of the cantilevered portion. In some embodiments, the individual masks are aligned such that at least one nanowire column bridges the first layer and the second layer under a location of a mask. Partitioning further comprises removing the second semiconductor layer that is not protected by the individual masks. The second layer is removed until the insulator support beneath is exposed. As a result, each nano-colonnade device of the array comprises a segment of the second layer having a corresponding cantilevered portion (i.e., partitioned electrode), an underlying insulator support, the first layer (i.e., common electrode) and at least one bridging nanowire column between the second layer and the first layer.

Figure 4A:
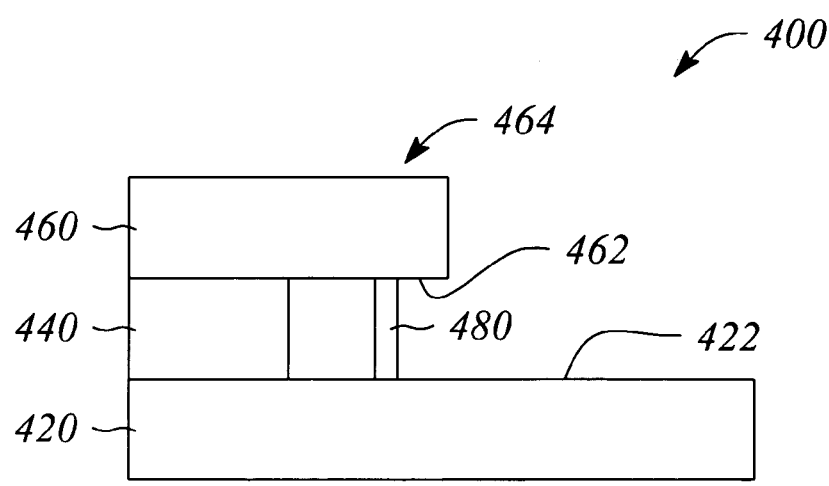
FIG. 4A illustrates a side view of a nano-colonnade structure according to an embodiment of the present invention.
Figure 4B:
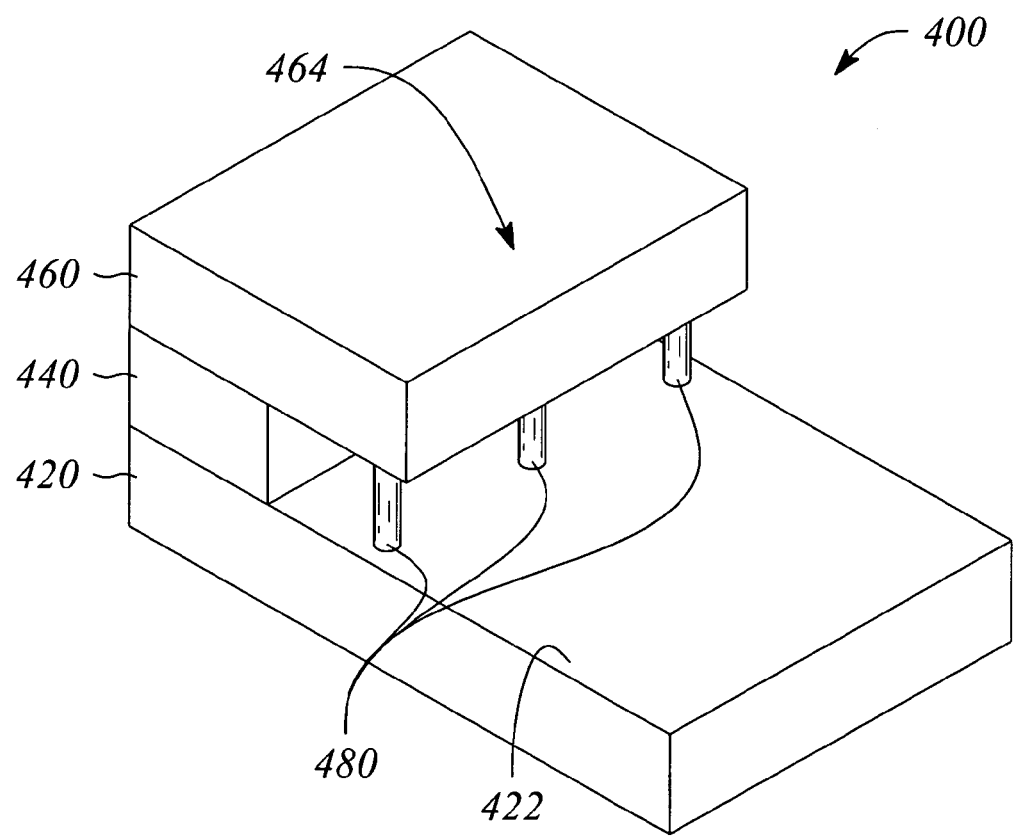
FIG. 4B illustrates a perspective view of the nano-colonnade structure of FIG. 4A.

In other embodiments of the present invention, a nano-colonnade structure is provided. FIG. 4A illustrates a side view and FIG. 4B illustrates a perspective view of a nano-colonnade structure 400 according to an embodiment of the present invention. The nano-colonnade structure 400 comprises a semiconductor (or first) layer 420 having a (111) horizontal surface 422, a cantilevered (or second) layer 460 having a horizontal surface 462, and an insulator layer or support 440 between the semiconductor layer 420 and the cantilevered layer 460. The cantilevered layer 460 has a portion 464 that overhangs the insulator support 440. The horizontal surface 462 of the overhanging portion 464 faces the (111) horizontal surface 422 of the semiconductor layer 420 and is spaced from the (111) surface 422 by a distance equal to a thickness or height of the insulator layer support 440. The nano-colonnade structure 400 further comprises a nanowire column 480 that extends between the (111) horizontal surface 422 of the semiconductor layer 420 and the facing horizontal surface 462 of the overhanging portion 464 of the cantilevered layer 460. The nanowire column 480 originates from the (111) horizontal surface 422 of the semiconductor layer 420. By originates, it is meant that the nanowire column 480 is grown from the (111) surface 422 of the semiconductor layer 420 at a location where a nanoparticle was deposited. The nanowire column 480 was grown in a direction that is preferentially nearly normal to the (111) horizontal surface 422 to connect to the facing horizontal surface 462. More than one nanowire column 480 may be grown to extend between the semiconductor layer 420 and the cantilevered layer, as illustrated FIG. 4B, by way of example.

In some embodiments, the nano-colonnade structure is a nano-scale electronic-type device or circuit, wherein the semiconductor layer 420 may be highly doped to be an electrode layer 420, or have less doping, graded doping levels, or have different material layers introduced or integrated therein, depending on the application of the electronic-type nano-scale device. The second or cantilevered layer 460 may be either a metal material or a semiconductor material that, like the first layer 420, may be highly doped to form a cantilevered electrode layer 460, or the semiconductor material may be doped to a lesser level, have graded doping levels, or have different material layers introduced or integrated therein, depending on the application of the electronic-type nano-scale device. The nanowire is a semiconductor material that may be doped with a level of doping, or have introduced a material or impurity, that facilitates a particular application for the electronic-type nano-scale device. For example, the electronic-type nano-scale device may be used in a field effect transistor (FET), a sensor, a laser or another optoelectronic application, in each of which case would dictate different combinations of materials, dopants and dopant levels to facilitate each application and are familiar to one skilled in the art.

Figure 5:
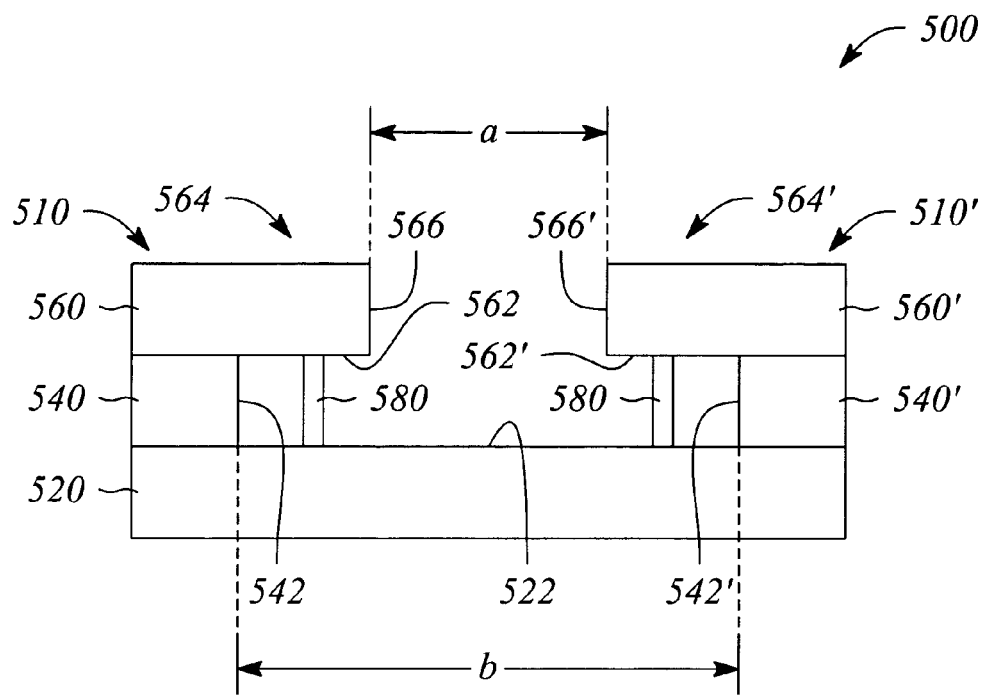
FIG. 5 illustrates a side view of another nano-colonnade structure according to an embodiment of the present invention.

In some embodiments, the nano-colonnade structure 400 further comprises a mirror image of the cantilevered layer 460 and the insulator support 440 spaced apart on the semiconductor layer 420. FIG. 5 illustrates a side view of another nano-colonnade structure 500, according to an embodiment of the present invention, that has a mirror image. The mirror image nano-colonnade structure 500 comprises a first structure 510 that comprises a common (first) semiconductor layer 520 with a (111) horizontal surface 522, a second or cantilevered layer 560 having a horizontal surface 562, and an insulator support 540 between the common layer 520 and the cantilevered layer 560 and adjacent to the respective horizontal surfaces 522, 562. The cantilevered layer 560 includes a portion 564 that overhangs the insulator layer support 540. The horizontal surface 562 of the overhanging portion 564 is spaced from and faces the (111) horizontal surface 522 of the common layer 520 a distance equal to a thickness of the insulator layer support 540. The first structure 510 is essentially equivalent to the nano-colonnade structure 400 of FIG. 4.

The mirror image nano-colonnade structure 500 further comprises a second structure 510' that comprises the common semiconductor layer 520, a second or cantilevered layer 560' with a horizontal surface 562' with an overhanging portion 564', and an insulator support 540' between the common layer 520 and the cantilevered layer 560'. A free edge 566 of the overhanging portion 564 of the first structure 510 faces a free edge 566' of the overhanging portion 564' of the second structure 510'. The free edges 566, 566' are separated by a first gap having a width a. An inner face 542 of the insulator layer support 540 of the first structure 510 faces an inner face 542' of the insulator layer support 540' of the second structure 510'. The inner faces 542, 542' are separated by a second gap having a width b. The width b is larger than the width a as a result of the overhanging portions 564, 564'. As such, the first structure 510 and the second structure 510' are essentially mirror images spaced apart by at least a distance equal to the first gap width a.

The mirror image nano-colonnade structure 500 further comprises nanowire columns 580 that extend nearly vertically between the respective horizontal surfaces 522, 562 and 522, 562' of the mirror image structures 510, 510' to bridge the common layer 520 and the respective cantilevered layers 560, 560'. The nanowire columns 580 in each mirror image structure 510, 510' may or may not be mirror images.

Figure 6:
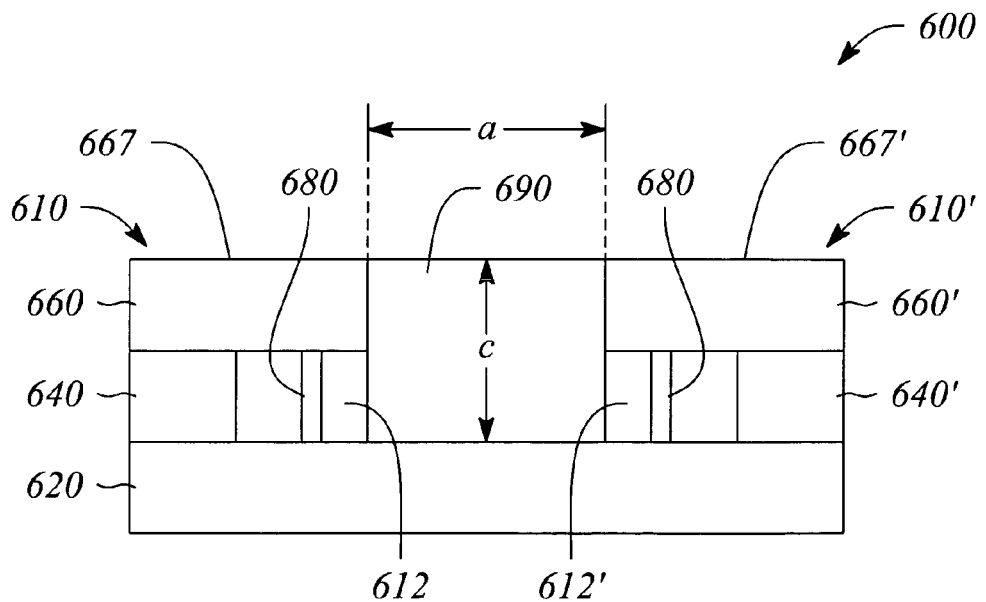
FIG. 6 illustrates a side view of another nano-colonnade structure according to an embodiment of the present invention.

In some embodiments, the mirror image nano-colonnade structure 500 further comprises a filler material between the mirror image structures. The filler material covers the (111) horizontal surface and fills the first gap having the width a between the structures to be essentially planar with an external horizontal surface of the cantilevered layers 560, 560'. FIG. 6 illustrates a side view of another nano-colonnade structure 600, according to an embodiment of the present invention, that has a filler material between mirror image structures. The nano-colonnade structure 600 comprises a first structure 610, which is essentially equivalent to the first structure 510, and a second structure 610', which is essentially equivalent to the second structure 510', that are described above for the mirror image nano-colonnade structure 500. The nano-colonnade structure 600 further comprises nanowire columns 680 that extend between the common layer 620 and the cantilevered layers 660, 660', also as described above for the nano-colonnade structure 500.

The nano-colonnade structure 600 further comprises a filler material 690. In some embodiments, the filler material 690 essentially fills an area having a width equal to the first gap width a for a distance c from the (111) horizontal surface of the common layer 620 to external horizontal surfaces 667, 667' of the cantilevered layers 660, 660'. In some embodiments, the filler material 690 does not extend under the overhanging portions where the nanowire columns 680 are located. As such, nano-channels 612, 612' are formed by junctions of the filler material 690 with the overhanging portions and with the common layer 620 and by the insulator supports 640, 640' in the first and second mirror image structures 610, 610'. The nano-channels 612, 612' substantially surround the locations of the nanowire columns 680.

The filler material 690 is an electrically nonconductive or an insulating material including, but not limited to, an oxide material or a nitride material of the semiconductor material used for the semiconductor layer 620 or another insulating material. The filler material 690 may be applied to fill the first gap using known techniques including, but not limited to, e-beam evaporation. In some embodiments, the filler material 690 may be applied to over fill the gap area, in which case a planarization technique may be used to render an exposed surface of the filler material 690 planar with the external surfaces 667, 667' of the cantilevered layers 660, 660'. Planarization techniques are known in the art and include, but are not limited to, a chemical polishing, a mechanical polishing and chemical mechanical polishing (CMP).

The filler material 690 provides structural support to the first and second mirror image structures 610, 610', as well as facilitating one or both of the physical separation and the electrical separation between the first and second mirror image structures 610, 610'. As such, the first and second structures 610, 610' may be spaced closer together to provide greater device density. Moreover, the formed nano-channels 612, 612' provide a protective function for the nanowire columns 680. The nano-colonnade structure 600 may be considered a building block of a more complex structure, such as multilayer nano-colonnade structure having greater circuit density, for example. Alternatively, the nano-colonnade structure 600 may be used in device applications requiring a physical barrier that the filler material 690 provides for proper or enhanced operation.

Figure 7:
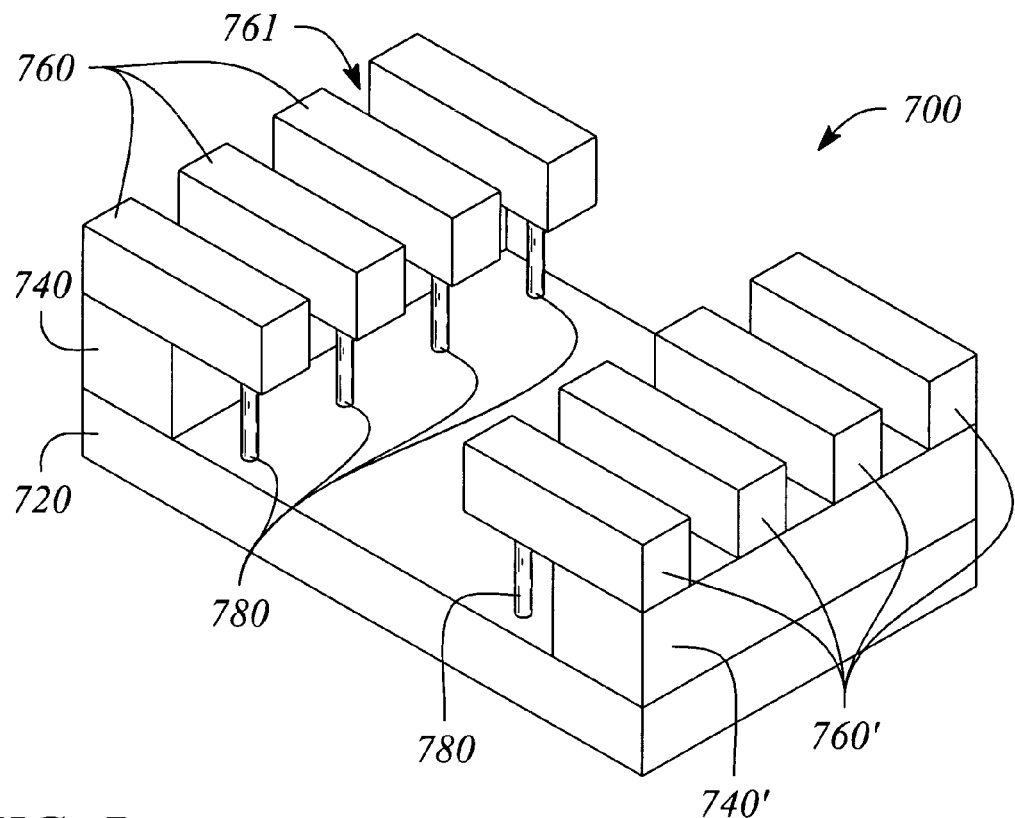
FIG. 7 illustrates a perspective view of a nano-colonnade device array according to an embodiment of the present invention.

In some embodiments of the present invention, a nano-colonnade array structure 700 is provided. FIG. 7 illustrates a perspective view of the nano-colonnade device array 700 according to an embodiment of the present invention. The nano-colonnade device array 700 comprises a first or common semiconductor layer 720 having a (111) horizontal surface, which will be referred to hereafter as "common electrode 720" for simplicity and not by way of limitation to an electrode application. The device array 700 further comprises a coplanar array of spaced apart layer segments 760 of a second layer that is cantilevered over the (111) horizontal surface and separated from the common electrode 720 by an insulator layer support 740. Each of the coplanar spaced apart layer segments 760 will be referred to hereinafter as an "array electrode 760" for simplicity and not by way of limitation to an electrode application. The device array 700 further comprises a nanowire column 780 that extends from the (111) horizontal surface of the common electrode 720 and connects to an array electrode 760 at a horizontal surface thereof that faces the (111) horizontal surface for each array device. The array electrodes 760 are separated by a gap 761 from each other that provides electrical isolation between array electrodes 760. As such, each nano-colonnade device of the array 700 is separately addressable from the common electrode 720 and a respective array electrode 760.

In some embodiments, the nano-colonnade device array 700 further comprises a mirror image structure that faces the array of nano-colonnade devices and shares the common electrode 720. FIG. 7 illustrates the mirror image structure by way of example and not limitation herein. These embodiments are similar to that described above for the nano-colonnade structure 500, but for being an array having mirror image array electrodes 760' separated from the common electrode 720 by a mirror image insulator layer support 740'. In some of these embodiments, the nano-colonnade device array 700 further comprises a filler material (not illustrated) between the mirror image structures of the array. These embodiments are similar to that described above for the nano-colonnade structure 600, but for being an array.

Figure 8:
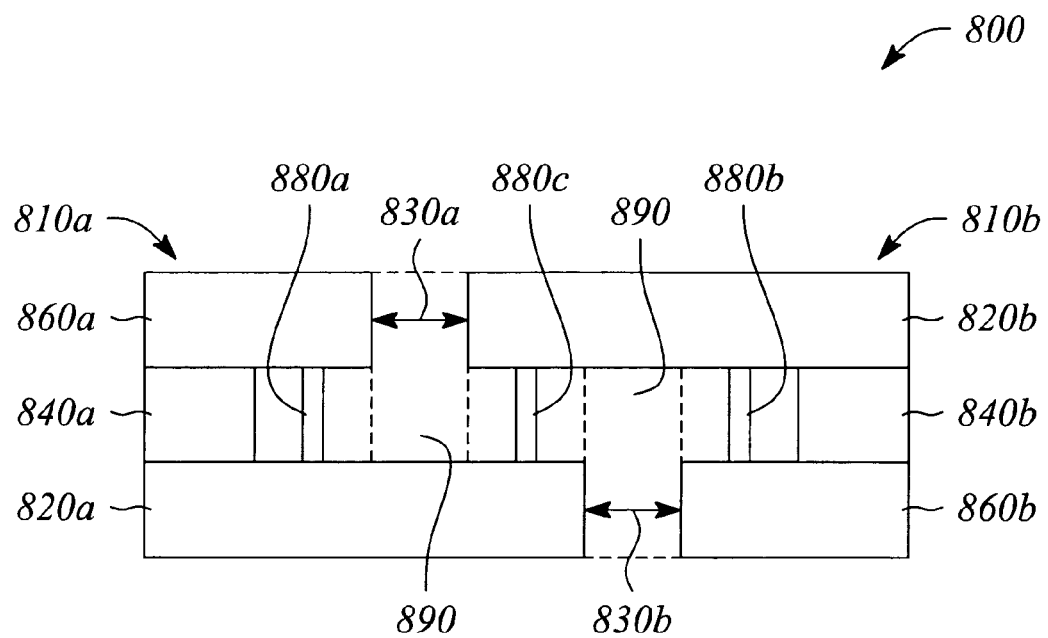
FIG. 8 illustrates a side view of an interconnected nano-colonnade structure according to an embodiment of the present invention.

In some embodiments of the present invention, an interconnected nano-colonnade structure 800 is provided. FIG. 8 illustrates a side view of the interconnected nano-colonnade structure 800 according to an embodiment of the present invention. The interconnected nano-colonnade structure 800 comprises a first nano-colonnade structure 810*a* similar to that described above for the nano-colonnade structure 400 illustrated in FIG. 4. The interconnected nano-colonnade structure 800 further comprises a second nano-colonnade structure 810*b*, also similar to that described above for the nano-colonnade structure 400 illustrated in FIG. 4, but for having a reversed vertical orientation relative to the first structure 810*a*. The first structure 810*a* and the second structure 810*b* are spaced apart by gaps 830*a*, 830*b*, which may be of the same width or one gap width may be different than the other. The interconnected nano-colonnade structure 800 further comprises a nanowire column 880*c* extending from a (111) horizontal surface of a first semiconductor layer 820*a* of the first structure 810*a* to a (111) horizontal surface of a first semiconductor layer 820*b* of the second structure 810*b*. In some embodiments, the interconnected nano-colonnade structure 800 further comprises a filler material 890 in one or both of the gaps 830*a*, 830*b*, that is similar to the filler material 690 described above for the structure 600. FIG. 8 illustrates the optional filler material 890 in the gaps 830*a*, 830*b* by way of example only, as illustrated by dashed-lines. In these embodiments, the filler material 890 not only facilitates support for the interconnected structure 800, but also creates one or more protective nano-channels for the nanowire columns 880*a*, 880*b*, 880*c* that are located in three locations in FIG. 8. A first nano-channel is created when the filler material is in the gap 830*a* between the filler material and the insulator support 840*a* in a vertical plane and the first layer 820*a* and the second layer 860*a* in a horizontal plane to surround the nanowire 880*a*. A second nano-channel is similarly created when the filler material is in the gap 830*b* between the filler material and insulator support 840*b* in the vertical plane and the second layer 860*b* and the first layer 820*b* in the horizontal plane to surround the nanowire 880*b*. A third nano-channel is formed when the filler material is in both of the gaps 830*a*, 830*b* between the filler materials in the vertical plane and the first layers 820*a*, 820*b* in the horizontal plane to surround the nanowire 880*c*.

In some embodiments, the interconnected nano-colonnade structure 800 may be supported by a substrate (not illustrated). For example, the support substrate may be adjacent to the layers 820*a*, 860*b* or to the layers 860*a*, 820*b*. In some embodiments, at least one of the first nano-colonnade structure 810*a* and the second nano-colonnade structure 810*b* is an electronic circuit. In some embodiments, the first structure 810*a* of interconnected nano-colonnade structure 800 is connected to the second structure 810*b* thereof using the method 200 of interconnecting nano-scale devices with a nanowire, described above and illustrated in FIG. 2. Moreover, any of the embodiments of the present invention described or illustrated herein may be supported by a substrate adjacent to either the first layer or the second layer on a side or surface that is opposite to the (111) horizontal surface of the first layer or the facing horizontal surface of the second layer.

Figure 9:
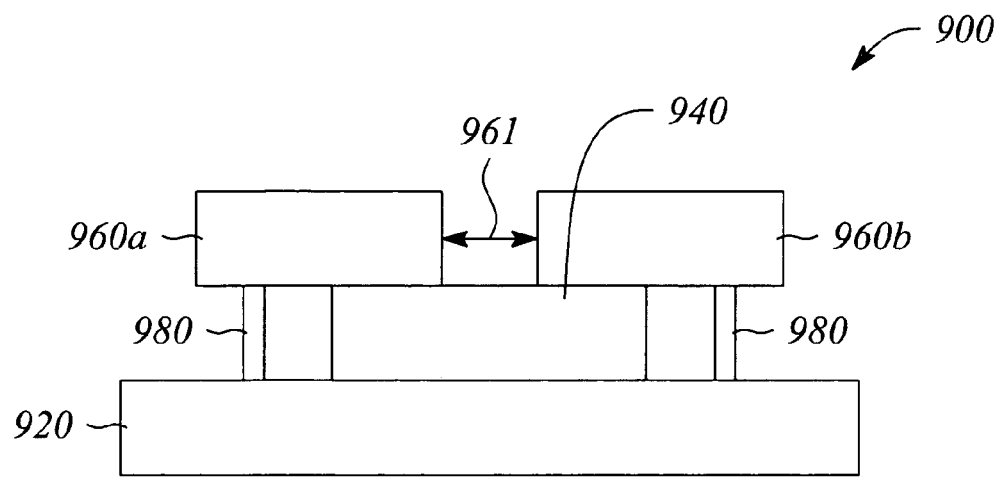
FIG. 9 illustrates a side view of another nano-colonnade structure according to an embodiment of the present invention.

FIG. 9 illustrates an example of another nano-colonnade structure 900 according to an embodiment of the present invention. The nano-colonnade structure 900 comprises a first or common semiconductor layer 920 having a (111) horizontal surface. The structure 900 further comprises dual second or cantilevered layers 960*a*, 960*b* separated by a space 961 in a coplanar horizontal plane. The dual cantilevered layers 960*a*, 960*b* are supported by an insulator support 940. In some embodiments not illustrated, a cantilevered layer is not separated by a space, but instead is a continuous layer that overhangs the insulator support on opposite sides. The insulator support 940 further separates the dual layers 960*a*, 960*b* from the common layer 920 in a vertical stacked relationship. The nano-colonnade structure 900 further comprises nanowire columns 980 that separately interconnect the common layer 920 to the dual layers 960*a*, 960*b*. An overhanging portion of each of the dual cantilevered layers 960*a*, 960*b* has a horizontal surface that faces the (111) horizontal surface of the common layer 920. The nanowire columns 980 originate from the (111) horizontal surface to extend and connect to the facing horizontal surfaces of the overhanging portions of the dual layers 960*a*, 960*b*. The nano-colonnade structure 900 is another example of the many nano-colonnade structures described herein. Other nano-colonnade structures may be realized by one skilled in the art that also incorporate the principles of the embodiments of the present invention. All of such realized structures are within the scope of the embodiments of the present invention.

The nano-colonnade structures described herein are capable of having nanowire columns with a precise length that is defined by the thickness of the insulator layer or support. The insulator layer is grown to a precise thickness on the semiconductor layer having the (111) horizontal surface during fabrication, according to some embodiments of the method 300 of fabricating a nano-colonnade structure, for example. The precise length of the nanowire columns facilitates using the nano-colonnade structure in many applications where precise length of the nanowire columns is desirable or even needed, such as for laser applications.

Figure 10:
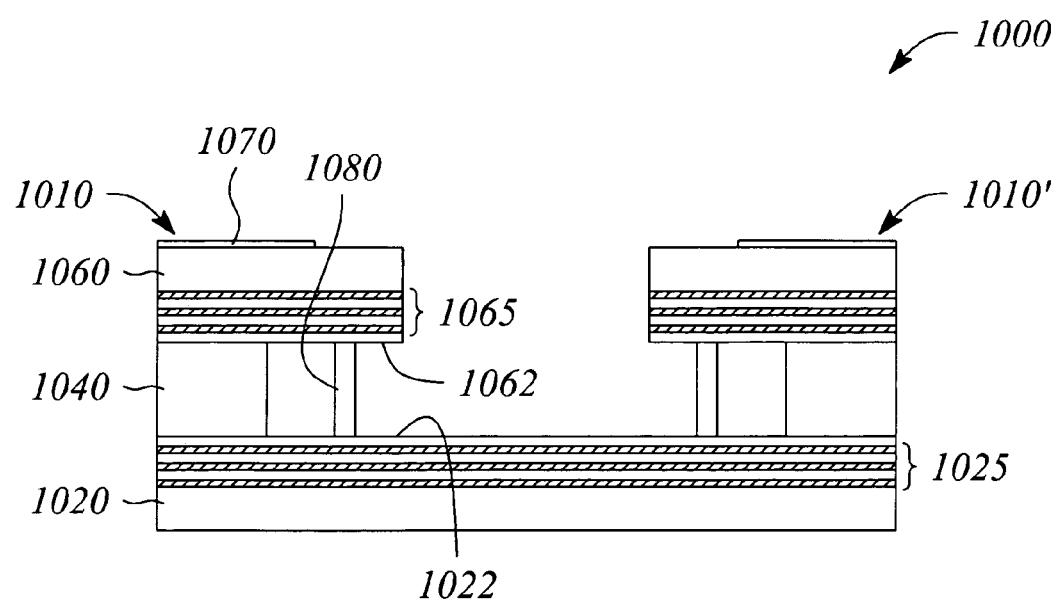
FIG. 10 illustrates a side view of a nano-colonnade laser structure according to an embodiment of the present invention.

In some embodiments of the present invention, a nano-vertical cavity surface emitting laser (nano-VCSEL) device having nanowire columns is provided. FIG. 10 illustrates a side view of a nano-colonnade laser structure 1000 according to an embodiment of the present invention. The nano-colonnade laser structure 1000 of the present invention is a surface emitting-type semiconductor laser (i.e., nano-VCSEL) as opposed to an edge emitting-type semiconductor laser. As is known in the art, light is emitted from a surface emitting-type laser in a direction perpendicular to a plane of the substrate or wafer. For the edge emitting-type laser, light is emitted in a direction of the plane of the substrate. The optical cavity of a surface emitting-type laser is formed by distributed Bragg reflectors that sandwich an active layer. See, for example, Michael R. T. Tan et al., "Surface Emitting Laser for Multimode Data Link Applications", *Hewlett-Packard Journal*, February 1995, pp. 67-71, incorporated herein by reference.

The nano-colonnade laser 1000 comprises a first semiconductor layer 1020 having a (111) horizontal surface 1022. The nano-colonnade laser 1000 further comprises a second semiconductor layer 1060 and an insulator layer support 1040 between the first layer 1020 and the second layer 1060. The second layer 1060 has a cantilevered portion with a horizontal surface 1062 that faces the (111) horizontal surface 1022 of the first layer 1020. The cantilevered portion is supported by the insulator support 1040. The nano-colonnade laser 1000 further comprises a semiconductor nanowire column 1080 extending from the (111) horizontal surface 1022 of the first layer 1020 to the facing horizontal surface 1062 of the cantilevered portion of the second layer 1060. In some embodiments, one or more of the semiconductor layers 1020, 1060, the insulator layer support 1040 and the nanowire column 1080 are lattice matched. The first and second semiconductor layers 1020, 1060 are typically doped while the insulator layer support 1040 is undoped to facilitate the electrical isolation between the first and second semiconductor layers 1020, 1060.

The nanowire columns 1080 have a precise length that is essentially equivalent to, and controlled by, a thickness or height of the insulator layer support 1040. The height or thickness of the insulator support 1040 also defines a distance between the respective horizontal surfaces 1022, 1062 of the first layer 1020 and the second layer 1060.

In some embodiments, the nano-colonnade laser structure 1000 further comprises a contact pad or electrode 1070 adjacent to a horizontal surface of the second layer 1060 that is opposite to the facing horizontal surface 1062. The contact pad 1070 comprises an electrically conductive material. In some embodiments, the contact pad 1070 is selected from a conductive metal and a highly doped semiconductor non-metal material. In some embodiments, the electrically conductive material is an optically transparent material, such as ITO. Metals, such as gold (Au), aluminum (Al), platinum (Pt), palladium (Pd), copper (Cu), nickel (Ni) and silver (Ag), for example, and a metal-semiconductor alloy are some materials that will work as the contact pad 1070. For silicon or SOI wafers, a metal-silicide alloy, including but not limited to, titanium-silicide, may be used to form the contact pad 1070. A conductive nonmetal material, such as a highly doped polysilicon, also may be used for the contact pad 1070.

The contact pad 1070 may be formed on the opposite horizontal surface of the second semiconductor layer 1060 using a deposition technique including, but not limited to, electron-beam evaporation, sputtering, evaporation, chemical vapor deposition, molecular beam epitaxy, self assembly monolayer (SAM) growth, or other selective or nonselective deposition techniques, and optionally using thermal annealing and using any available lithographic process for patterning, for example. Moreover, gold may be deposited on a GaAs second semiconductor layer 1060 using a rapid thermal process and annealing. The above-mentioned deposition processes and materials are known to those skilled in the art. These techniques and other materials and processes, which are readily devised by the skilled artisan, are within the scope of the embodiments of the present invention.

In some respects, the nano-colonnade laser structure 1000 is similar to the nano-colonnade structure 400 described above. In some embodiments, the nano-colonnade laser 1000 comprises mirror image structures 1010, 1010' that, in some respects, are similar to the first and second mirror image structures 510, 510', 610, 610' of the nano-colonnade structures 500 and 600 described above. FIG. 10 illustrates the mirror image structure 1010, 1010' embodiment by way of example and not by way of limitation. In some embodiments, the nano-colonnade laser 1000 is an array of laser devices that, in some respects, is similar to the nano-colonnade device array 700 described above.

The first semiconductor layer 1020 of the nano-colonnade laser 1000 comprises a first Bragg mirror structure 1025 adjacent to the (111) horizontal surface 1022 that is integrated into the first layer 1020. Moreover, the second semiconductor layer 1060 comprises a second Bragg mirror structure 1065 adjacent to the facing horizontal surface 1062 that is integrated into the second layer 1060. Each of the first and second Bragg mirror structures 1025, 1065 comprises a plurality of distributed Bragg reflector layers. In some embodiments, the Bragg mirror structures 1025, 1065 are lattice matched to one or more of the semiconductor layers 1020, 1060, the nanowire 1080 and the insulator layer 1040.

The Bragg mirror structures 1025, 1065 comprise alternating layers of semiconductor materials having different indices of refraction including, but not limited to, semiconductor materials of the group IV, the group III-V and the group II-VI semiconductor materials, or another semiconductor material. For example, at least one of the Bragg reflector layer materials has a different index of refraction from the respective semiconductor material of the layer 1020, 1060 into which the Bragg reflector material is integrated. In some embodiments, the Bragg reflector layer further comprises a p-type or an n-type dopant to facilitate current biasing of the nanowire column 1080. While doping the Bragg reflector layer may change a target reflectivity also, the change in reflectivity is very negligible with doping.

In some embodiments, the first semiconductor layer 1020, the second semiconductor layer 1060, the insulator layer support 1040 and the nanowire 1080 are lattice matched ones of a semiconductor material independently selected from the group III-V, such as InP, GaAs, AlGaAs, and InGaAs, for example and not by way of limitation. In some embodiments, the Bragg reflector materials are also from the group III-V, for example, and are lattice-matched to at least the first and second semiconductor layers 1020, 1060.

A substrate or wafer comprising an insulator layer 1040 sandwiched between the first semiconductor layer 1020 and the second semiconductor layer 1060 with the distributed Bragg mirrors 1025, 1065, according to any of the embodiments described above, may be specified to and manufactured by a wafer manufacturer, such as Oepic Inc. of Sunnyvale, Calif., for use in the nano-colonnade laser 1000 (e.g., see <http://www.oepic.com/hm021206/CustomProducts.asp>), by way of example and not by way of limitation.

Figure 11:
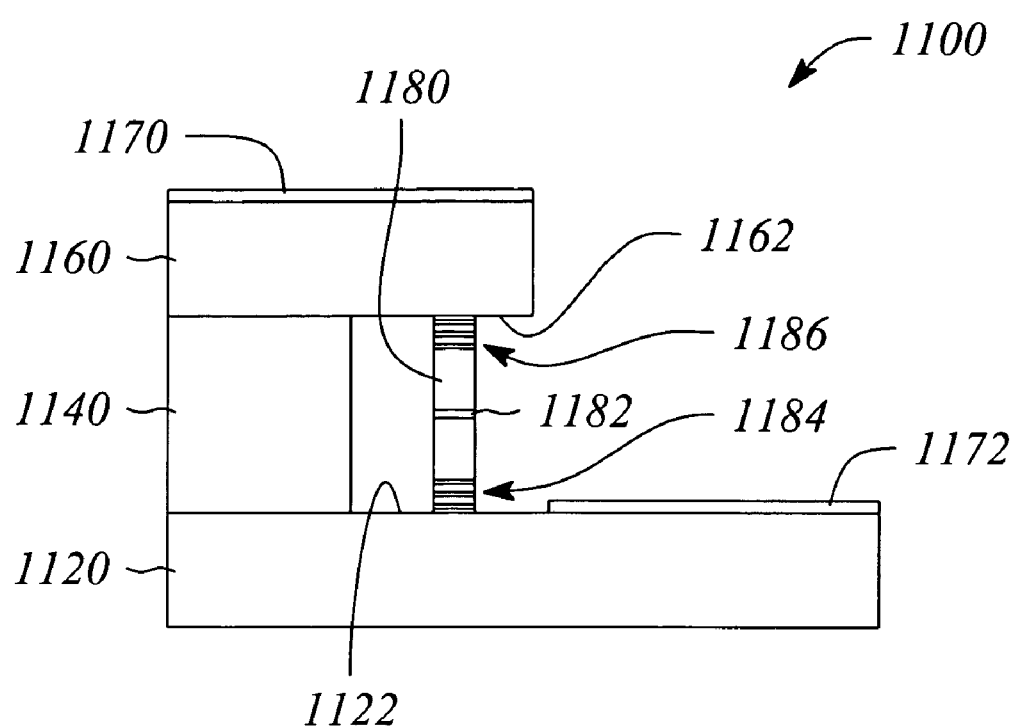
FIG. 11 illustrates a side view of a nano-colonnade VCSEL single photo emitter according to an embodiment of the present invention.

In other embodiments, the nano-VCSEL device is a single photon emitter having a nanowire column. FIG. 11 illustrates a side view of a nano-colonnade VCSEL single photon emitter 1100 according to an embodiment of the present invention. The nano-colonnade VCSEL emitter 1100 comprises a first semiconductor layer 1120 having a (111) horizontal surface 1122. The nano-colonnade VCSEL emitter 1100 further comprises a second semiconductor layer 1160 and an insulator layer support 1140 between the first layer 1120 and the second layer 1160. The second layer 1160 has a cantilevered portion with a horizontal surface 1162 that faces the (111) horizontal surface 1122 of the first layer 1120. The cantilevered portion is supported by the insulator support 1140. In some embodiments, the semiconductor layers 1120, 1160 are lattice matched.

The nano-colonnade VCSEL emitter 1100 further comprises a semiconductor nanowire column 1180 extending from the (111) horizontal surface 1122 of the first layer 1120 to the facing horizontal surface 1162 of the cantilevered portion of the second layer 1160. In some embodiments, the nanowire column 1180 is lattice matched to the semiconductor layers 1120, 1160. The nanowire column 1180 has a precise length defined by a thickness or height of the insulator layer support 1140, which represents a distance between the respective horizontal surfaces 1122, 1162 of the first layer 1120 and the second layer 1160. The nanowire column 1180 comprises a quantum dot (QD) 1182 integrated in the nanowire column 1180 during nanowire growth.

In some embodiments of the nano-colonnade VCSEL emitter 1100, the nanowire column 1180 further comprises Bragg mirrors 1184, 1186 integrated in the nanowire column 1180 also during nanowire growth. In some of these embodiments, a first Bragg mirror 1184 is located in the growing nanowire adjacent to the first semiconductor layer 1120. A second Bragg mirror 1186 is located in the nanowire column adjacent to the second semiconductor layer 1160. The quantum dot 1182 is located in the nanowire column 1180 between the first Bragg mirror 1184 and the second Bragg mirror 1186.

In some embodiments, the nanowire column 1180 may have a heterojunction at each interface with a Bragg mirror 1184, 1186 and the QD 1182, depending on the embodiment. However, when the size of the material is so small (i.e., atomic or nanometer scale), such as in the case of nanowires, you can grow a Bragg mirror or a QD on the nanowire and essentially still have single crystal material. In some embodiments, the QD 1182 and the Bragg mirrors 1184, 1186 are independently a semiconductor material including, but not limited to, the group IV, the group III-V and the group II-VI semiconductors, for example and not by way of limitation. For example, a Si nanowire may be grown and while it is growing, a small amount of InGaAs may be added as a nanowire segment and thereafter, the Si nanowire growth is continued until the Si nanowire bridges to the facing horizontal surface. The InGaAs segment is a quantum dot integrated into the Si nanowire in this example. In some embodiments, one or more of the nanowire column 1180, the QD 1182 and the Bragg mirrors 1184, 1186 is (are) lattice matched to each other and/or the first and second semiconductor layers.

In other embodiments (not illustrated), the first Bragg mirror 1184 is integrated into the first semiconductor layer 1120, while the second Bragg mirror 1186 is integrated into the second semiconductor layer 1160. In these other embodiments, the Bragg mirrors 1184, 1186 comprise a material and are introduced into the first and second semiconductor layers 1120, 1160 in much the same way as described above for the nano-colonnade laser structure 1000. The QD 1182 remains located in the nanowire column 1180 and effectively is still between the first and second Bragg mirrors 1184, 1186.

In some embodiments, the nano-VCSEL emitter 1100 further comprises a first contact pad or electrode 1170 adjacent to or on a horizontal surface of the second layer 1160 that is opposite to the facing horizontal surface 1162. The nano-VCSEL emitter 1100 further comprises a second contact pad or electrode 1172 adjacent to or on the (111) horizontal surface 1122 of the first layer 1120 that is spaced apart from the nanowire column 1180 (i.e., out from under the overhanging portion of the second layer 1160). The electrodes 1170, 1172 comprise an electrically conductive material selected from a conductive metal, metal-semiconductor alloy and a highly doped semiconductor or nonmetal material. In some embodiments, the electrically conductive material is an optically transparent material, such as ITO. The contact pad 1170, 1172 materials and techniques for depositing the contact pads 1170, 1172 on the respective semiconductor layer 1120, 1160 are essentially the same as those described above for the contact pad 1070 of the nano-colonnade laser 1000. In some respects, the nano-VCSEL emitter 1100 is similar to the nano-colonnade structure 400 described above, but for the QD 1182, and the Bragg mirrors 1184, 1186.

In some embodiments, the QD 1182 may create cavities with three-dimensional photon confinement and discrete modes. In some embodiments, the laser cavity is pumped using optical pumping. In some embodiments, electrical pumping can be used rather than using optical pumping, such that efficiency may be improved. Further, in some embodiments, high speed biasing circuits can be monolithically integrated on a respective wafer for pulsed electrical pumping for the single photon emission.

As mentioned above, the embodiments of the nano-colonnade laser 1000 and of the nano-colonnade single photon emitter 1100 are vertical cavity surface emitting laser (VCSEL) structures. As such, a laser beam (not illustrated) would be emitted from a surface of the respective VCSEL structure 1000, 1100 perpendicular to a plane of the respective semiconductor layers 1020, 1060, 1120, 1160 and essentially aligned or coplanar with the vertical plane of the nanowire column 1080, 1180.

As such, in some embodiments when the contact pad 1070, 1170 is present, the contact pad does not extend on the surface of the second layer 1060, 1160 to overlap an area of the second layer 1060, 1160 aligned with the vertical nanowire column 1080, 1180. In other embodiments when the contact pad 1070, 1170 is present, the contact pad may overlap the aligned area, but is made from a material that does not interfere with the emission of the laser beam, such as an optically transparent material.

The nano-colonnade laser 1000 illustrated in FIG. 10 exemplifies an embodiment where the contact pad 1070 does not overlap the area of the second layer 1060, which is aligned with the nanowire column 1080, for example. In contrast, the nano-VCSEL emitter 1100 illustrated in FIG. 11 exemplifies an embodiment where the contact pad 1170 does overlap with the area of the second layer 1160 aligned with the nanowire column 1180, but may be an optically transparent material, for example. However, in some embodiments, a laser beam may be emitted from an area of the first layer 1020, 1120 aligned with the nanowire column 1080, 1180 that is otherwise unobstructed. These and other arrangements that achieve a non-obstructed laser beam emission realized by one skilled in the art are within the scope of the nano-colonnade laser 1000 and the nano-VCSEL emitter 1100 embodiments of the present invention.

Any of the nano-colonnade structures 400, 500, 600, 700, 800, 900, 1000 and 1100 may be fabricated using the various embodiments of the method 300 described above.

Thus, there have been described various embodiments of a method of interconnecting a nanowire between horizontal surfaces, a method of interconnecting nano-scale devices with a nanowire, and a method of fabricating a nano-colonnade structure. Moreover, there have been described various embodiments of nano-colonnade structures. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

For example, in some embodiments, the first layer or growth-originating layer 420, 520, 620, 720, 820a, 820b, 920, 1020, 1120 may be a semiconductor film or a thin catalyst film formed on any type of substrate or support. Moreover, a nanowire column 480, 580, 680, 780, 880a, 880b, 980, 1080, 1180 extending nearly normal to this first layer film may be provided by an intrinsic orientation of the first layer film, for example. In another example, the nanowire column may be oriented nearly normal to the first layer film surface using an extrinsic environmental variable including, but not limited to, one or more of an electric field, a magnetic field, temperature and plasma density, and a gradient of any thereof.

Moreover, in some embodiments, the first or growth-originating layer may have other than a [111] crystal orientation, such that a nanowire column may be grown from crystal faces and crystal axes other than the (111) surface, for example. See, for example, Mao, Belcher et al., *Science*, 303, pg. 213 (2004) or Tang, Giersig et al., *Science*, 297, pg. 237 (2002), incorporated herein by reference.

In still other embodiments, the nanowire column may be another material other than the above-described semiconductor materials, metals and metal-semiconductor alloys. For example, a nanowire column of an insulating material including, but not limited to, a silica nanowire, may be grown. The insulating nanowire column may be used for photonic applications, for example. In some embodiments, the insulating nanowire column may be modified subsequently to become semiconducting or conducting, for example. See, for example, Pan, Wang et al., *JACS*, 124, pg. 1817 (2002), incorporated herein by reference.

In other embodiments, the nanowire column may be grown 150, 250, 350 from a bulk catalyst surface as opposed to using the above-described nanoparticle catalyst, for example. Again, see Pan, Wang et al., *JACS*, 124, pg. 1817 (2002), cited supra. All such embodiments and examples herein are within the scope of the present invention.

What is claimed is:

1. A nano-colonnade structure comprising:
a first layer of a semiconductor material having a (111) horizontal surface;
a second layer;
an insulator support between the first layer and the second layer that separates the first layer from the second layer, a portion of the second layer overhanging the insulator support, such that a horizontal surface of the overhanging portion is spaced from and faces the (111) horizontal surface of the first layer; and
a nanowire column extending nearly vertically from the (111) horizontal surface to the facing horizontal surface of the overhanging portion, such that the nanowire column connects the first layer to the second layer, wherein the nanowire column is spaced from the insulator support, such that a gap between the nanowire column and the insulator support is provided, and wherein the nanowire column is an inorganic material.

2. The nano-colonnade structure of claim 1, wherein the nano-colonnade structure is an array of nano-scale colonnade devices supported by the first layer, the array having physically separated segments of the second layer, wherein each colonnade device comprises the first layer, a different segment of the second layer having a respective overhanging portion, the insulator support between the first layer and the segment, and a nanowire column extending from the first layer to the respective overhanging portion of the second layer segment.

3. The nano-colonnade structure of claim 2, wherein the first layer semiconductor is highly doped to form a common electrode, the second layer being either a highly doped semiconductor or a metal to form an electrode, the second layer segments being individual electrodes for separately addressing the devices of the affay.

4. A nano-colonnade structure comprising:
a first layer of a semiconductor material having a (111) horizontal surface:
a second layer;
an insulator support between the first layer and the second layer that separates the first layer from the second layer, a portion of the second layer overhanging the insulator support, such that a horizontal surface of the overhanging portion is spaced from and faces the (111) horizontal surface of the first layer; and
a nanowire column extending nearly vertically from the (111) horizontal surface to the facing horizontal surface of the overhanging portion, such that the nanowire column connects the first layer to the second layer,
wherein the nano-colonnade structure is an array of nano-scale colonnade devices supported by the first layer, the away having physically separated segments of the second layer, wherein each colonnade device comprises the first layer, a different segment of the second layer having a respective overhanging portion, the insulator support between the first layer and the segment, and a nanowire column extending from the first layer to the respective overhanging portion of the second layer segment, and
wherein the second layer is a semiconductor material, the nano-colonnade array further comprising:
a first contact pad on the (111) horizontal surface of the first layer spaced from the nanowire columns out from under the overhanging portions; and
a second contact pad on a horizontal surface of each of the segments that is opposite the facing horizontal surface, the contact pads being an electrically conductive material, the first contact pad being a common electrode, the second contact pads being individual electrodes for separately addressing the devices of the array.

5. A nano-colonnade structure comprising:
a first layer of a semiconductor material having a (111) horizontal surface;
a second layer;
an insulator support between the first layer and the second layer that separates the first layer from the second layer, a portion of the second layer overhanging the insulator support, such that a horizontal surface of the overhanging portion is spaced from and faces the (111) horizontal surface of the first layer; and
a nanowire column extending nearly vertically from the (111) horizontal surface to the facing horizontal surface of the overhanging portion, such that the nanowire column connects the first layer to the second layer,
wherein the nano-colonnade structure is an array of nano-scale colonnade devices supported by the first layer, the anay having physically separated segments of the second layer, wherein each colonnade device comprises the first layer, a different segment of the second layer having a respective overhanging portion, the insulator support between the first layer and the segment, and a nanowire column extending from the first layer to the respective overhanging portion of the second layer segment, and
wherein the second layer segments having overhanging portions and the insulator support of the array form a first section, the nano-colonnade structure further comprising a second section that is a minor image of the first section on the first layer, the second section comprising minor image second layer segments having overhanging portions, a mirror image insulator support, and nanowire columns extending from the first layer to each mirror image second layer segment of the array, the second section facing the first section and being spaced from the first section, such that the respective overhanging portions are separated by a gap.

6. The nano-colonnade structure of claim 1, wherein the nano-colonnade structure is an electronic circuit device, the first layer being highly doped, the second layer being either a highly doped semiconductor material or a conductive metal, the nanowire column optionally being doped.

7. The nano-colonnade structure of claim 1, further comprising
a first contact pad on the (111) horizontal surface of the first layer spaced from the nanowire column; and
a second contact pad on a horizontal surface of the second layer opposite the facing horizontal surface, the contact pads being an electrically conductive material.

8. The nano-colonnade structure of claim 1, wherein the second layer is selected from a semiconductor material having any crystal orientation and a metal.

9. The nano-colonnade structure of claim 1, further comprising a substrate made of an insulating material that supports either the first semiconductor layer or the second layer.

10. A nano-colonnade structure comprising:
a first layer of a semiconductor material having a (111) horizontal surface;
a second layer;
an insulator support between the first layer and the second layer that separates the first layer from the second layer, a portion of the second layer overhanging the insulator support, such that a horizontal surface of the overhanging portion is spaced from and faces the (111) horizontal surface of the first layer; and
a nanowire column extending nearly vertically from the (111) horizontal surface to the facing horizontal surface of the overhanging portion, such that the nanowire column connects the first layer to the second layer,
wherein the second layer with the overhanging portion and the insulator support form a first section, the nano-colonnade structure further comprising a second section that is a minor image of the first section on the first layer, the second section comprising a minor image second layer having an overhanging portion, a mirror image insulator support, and another nanowire column extending from the first layer to the mirror image second layer, the second section facing the first section and being spaced from the first section, such that the respective overhanging portions are separated by a gap.

11. The nano-colonnade structure of claim 10, wherein further comprising an insulating material that fills the gap between the first section and the second section from the first layer to an external horizontal surface of the second layers.

12. The nano-colonnade structure of claim 11, wherein the insulating filler material in the gap and the respective insulator layer supports form opposite sides of a channel that houses the nanowire columns.

13. A nano-colonnade structure comprising:
a first layer of a semiconductor material having a (111) horizontal surface;
a second layer;
an insulator support between the first layer and the second layer that separates the first layer from the second layer, a portion of the second layer overhanging the insulator support, such that a horizontal surface of the overhanging portion is spaced from and faces the (111) horizontal surface of the first layer; and
a nanowire column extending nearly vertically from the (111) horizontal surface to the facing horizontal surface of the overhanging portion, such that the nanowire column connects the first layer to the second layer,
wherein the first layer comprises an integrated first Bragg reflector adjacent to the (111) horizontal surface, the second layer being a semiconductor material, the second semiconductor layer comprising an integrated second Bragg reflector adjacent to the facing horizontal surface, such that the nano-colonnade structure forms a nano-vertical cavity surface emitting laser (nano-VCSEL).

14. An interconnected nano-colonnade structure comprising:
a first nano-colonnade device;
a second nano-colonnade device; and
a first nanowire column that extends nearly vertically from a (111) horizontal surface of the first device to a (111) horizontal surface of the second device that faces the (111) horizontal surface to connect the first device to the second device.

15. The nano-colonnade structure of claim 14, further comprising an insulating filler material in gaps between the first device and the second device, the filler material forming a channel around a location of the nanowire column.

16. The nano-colonnade structure of claim 14, wherein the first nano-colonnade device and the second nano-colonnade device each comprise:
a first layer of a semiconductor material having the (111) horizontal surface;
an insulator support;
a second layer separated from the first layer by the insulator support, the second layer hanging over a portion of the (111) horizontal surface of the first layer, such that a horizontal surface of the overhanging second layer is spaced from and faces the (111) horizontal surface of the first layer; and
a second nanowire column extending nearly vertically from the (111) horizontal surface of the first layer to the facing horizontal surface of the overhanging second layer, the second nanowire column connecting the first layer to the second layer.

17. The nano-colonnade structure of claim 16, wherein the first device and the second device are in a reverse stacked relationship, such that the (111) horizontal surfaces of the first layers of each device overhang and face each other, the first nanowire column interconnecting the respective first layers.

18. A nano-colonnade laser structure comprising:
a first semiconductor layer having a (111) horizontal surface, the first layer comprising a first integrated Bragg reflector;
a second semiconductor layer comprising a second integrated Bragg reflector;
an insulator support between the first layer and the second layer that separates the first layer from the second layer, a portion of the second layer overhanging the insulator support, such that a horizontal surface of the overhanging portion is spaced from and faces the (111) horizontal surface of the first layer; and
a semiconductor nanowire column extending nearly vertically from the (111) horizontal surface to the facing horizontal surface of the overhanging portion, such that the nanowire column connects the first layer to the second layer, wherein the Bragg reflectors and the nanowire column form a laser cavity of a nano-vertical cavity surface emitting laser (nano-VCSEL).

19. The nano-colonnade laser structure of claim 18, wherein the first integrated Bragg reflector and the second integrated Bragg reflector are lattice matched to one or more of the first layer, the second layer, the insulator support and the nanowire column.

20. The nano-colonnade structure of claim 14, wherein the first nano-colonnade device and the second nano-colonnade device are in a reverse stacked relationship, such that the (111) horizontal surface of a first layer of each nano-colonnade device overhangs and faces each other, the first nanowire column interconnecting the respective first layers.

* * * * *

UNITED STATES PATENT AND TRADEMARK OFFICE
CERTIFICATE OF CORRECTION

PATENT NO. : 7,307,271 B2
APPLICATION NO. : 10/982051
DATED : December 11, 2007
INVENTOR(S) : M. Saif Islam et al.

It is certified that error appears in the above-identified patent and that said Letters Patent is hereby corrected as shown below:

In column 21, line 67, in Claim 3, delete "affay" and insert -- array --, therefor.

In column 22, line 3, in Claim 4, after "surface" delete ":" and insert -- ; --, therefor.

In column 22, line 17, in Claim 4, delete "away" and insert -- array --, therefor.

In column 22, line 52, in Claim 5, delete "anay" and insert -- array --, therefor.

In column 22, line 63, in Claim 5, delete "minor" and insert -- mirror --, therefor.

In column 22, line 65, in Claim 5, delete "minor" and insert -- mirror --, therefor.

In column 23, line 42, in Claim 10, delete "minor" and insert -- mirror --, therefor.

In column 23, line 43, in Claim 10, delete "minor" and insert -- mirror --, therefor.

Signed and Sealed this

Fourteenth Day of July, 2009

JOHN DOLL
*Acting Director of the United States Patent and Trademark Office*